(12) United States Patent
Kruglick

(10) Patent No.: US 9,157,669 B2
(45) Date of Patent: Oct. 13, 2015

(54) HETEROGENEOUS ELECTROCALORIC EFFECT HEAT TRANSFER DEVICE

(75) Inventor: Ezekiel Kruglick, Poway, CA (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 557 days.

(21) Appl. No.: 13/145,948

(22) PCT Filed: Apr. 20, 2011

(86) PCT No.: PCT/US2011/033220
§ 371 (c)(1),
(2), (4) Date: Jul. 22, 2011

(87) PCT Pub. No.: WO2012/144995
PCT Pub. Date: Oct. 26, 2012

(65) Prior Publication Data
US 2012/0267090 A1 Oct. 25, 2012

(51) Int. Cl.
*F25B 21/02* (2006.01)
*F25B 21/00* (2006.01)
*H01L 37/02* (2006.01)

(52) U.S. Cl.
CPC .............. *F25B 21/00* (2013.01); *H01L 37/02* (2013.01); *F25B 2321/001* (2013.01); *Y02B 30/66* (2013.01)

(58) Field of Classification Search
CPC ... F25B 21/00; F25B 2321/001; H01L 37/02; Y02B 30/66
USPC .............................. 62/3.2, 3.3, 3.7
See application file for complete search history.

(56) References Cited

U.S. PATENT DOCUMENTS

| 2,978,875 A | 4/1961 | Lackey et al. |
| 4,673,030 A | 6/1987 | Basiulis |
| 4,757,688 A | 7/1988 | Basiulis et al. |
| 4,929,516 A | 5/1990 | Pryor et al. |
| 5,040,381 A | 8/1991 | Hazen |
| 5,229,566 A | 7/1993 | Alexandres |

(Continued)

FOREIGN PATENT DOCUMENTS

| CN | 86101652 A | 11/1986 |
| CN | 1237791 A | 12/1999 |

(Continued)

OTHER PUBLICATIONS

McNeil, D.A., "Pressure Drop and Heat Transfer Distributions Around a Bundle of Plasma-Treated Tubes Condensing Dropwise," Department of Mechanical and Chemical Engineering, Heriot-Watt University, Dec. 1999.

(Continued)

*Primary Examiner* — Mohammad M Ali
*Assistant Examiner* — Raheena Rehman
(74) *Attorney, Agent, or Firm* — Maschoff Brennan

(57) ABSTRACT

Technologies are generally described herein for electrocaloric effect heat transfer devices and methods effective to facilitate heat transfer over a wide operating temperature range of a corresponding heat source. Some example heat transfer devices may include multiple heat transfer stacks with at least two heat transfer stacks having electrocaloric effect materials with varying effective temperature ranges. The combined effective temperature ranges of the multiple heat transfer stacks encompass the operating temperature range of the heat source.

24 Claims, 8 Drawing Sheets

(56) References Cited

U.S. PATENT DOCUMENTS

| | | | |
|---|---|---|---|
| 5,515,238 | A | 5/1996 | Fritz et al. |
| 5,690,849 | A | 11/1997 | DeVilbiss et al. |
| 6,285,079 | B1 | 9/2001 | Kunikiy |
| 6,300,150 | B1 | 10/2001 | Venkatasubramanian |
| 6,556,752 | B2 * | 4/2003 | Fang et al. ............... 385/52 |
| 6,588,215 | B1 | 7/2003 | Ghoshal |
| 6,711,904 | B1 * | 3/2004 | Law et al. ............... 62/3.2 |
| 6,877,325 | B1 | 4/2005 | Lawless |
| 7,293,416 | B2 * | 11/2007 | Ghoshal ............... 62/3.7 |
| 7,305,839 | B2 * | 12/2007 | Weaver, Jr. ............... 62/132 |
| 7,421,845 | B2 * | 9/2008 | Bell ............... 62/3.2 |
| 7,475,551 | B2 * | 1/2009 | Ghoshal ............... 62/3.2 |
| 7,900,450 | B2 | 3/2011 | Gurin |
| 7,951,467 | B2 | 5/2011 | Tsushima |
| 8,869,541 | B2 | 10/2014 | Heitzler et al. |
| 2001/0023591 | A1 | 9/2001 | Maeda et al. |
| 2003/0033818 | A1 | 2/2003 | Kucherov et al. |
| 2005/0045702 | A1 | 3/2005 | Freeman et al. |
| 2005/0086948 | A1 * | 4/2005 | Milke-Rojo et al. ............ 62/3.7 |
| 2005/0269065 | A1 | 12/2005 | Chen |
| 2006/0092694 | A1 | 5/2006 | Choi et al. |
| 2006/0137359 | A1 * | 6/2006 | Ghoshal ............... 62/3.7 |
| 2006/0139116 | A1 | 6/2006 | Niki et al. |
| 2006/0201161 | A1 * | 9/2006 | Hirai et al. ............... 62/3.2 |
| 2007/0007613 | A1 | 1/2007 | Wang et al. |
| 2008/0303375 | A1 | 12/2008 | Carver |
| 2009/0139244 | A1 | 6/2009 | Ullo et al. |
| 2009/0258248 | A1 | 10/2009 | Tsushima |
| 2009/0293499 | A1 * | 12/2009 | Bell et al. ............... 62/3.2 |
| 2009/0301541 | A1 * | 12/2009 | Watts ............... 136/205 |
| 2009/0308081 | A1 * | 12/2009 | Ouyang et al. ............ 62/3.2 |
| 2010/0037624 | A1 | 2/2010 | Epstein et al. |
| 2010/0096113 | A1 | 4/2010 | Varanasi et al. |
| 2010/0140772 | A1 | 6/2010 | Lin et al. |
| 2010/0175392 | A1 | 7/2010 | Malloy et al. |
| 2010/0212327 | A1 | 8/2010 | Barve et al. |
| 2010/0218511 | A1 | 9/2010 | Rockenfeller |
| 2010/0230653 | A1 | 9/2010 | Chen |
| 2010/0236258 | A1 | 9/2010 | Heitzler et al. |
| 2011/0016885 | A1 | 1/2011 | Zhang et al. |
| 2011/0063904 | A1 | 3/2011 | Chang et al. |
| 2011/0113791 | A1 | 5/2011 | Kruglick |
| 2011/0146308 | A1 | 6/2011 | Casasanta |
| 2011/0203839 | A1 | 8/2011 | Iwamoto |
| 2011/0309463 | A1 | 12/2011 | Kruglick |
| 2012/0055174 | A1 | 3/2012 | Kruglick |

FOREIGN PATENT DOCUMENTS

| | | |
|---|---|---|
| CN | 1992358 A | 7/2007 |
| CN | 2932237 Y | 8/2007 |
| CN | 101246947 A | 8/2008 |
| CN | 101291769 A | 10/2008 |
| CN | 101587934 A | 11/2009 |
| CN | 101842647 A | 9/2010 |
| EP | 0194475 A2 | 9/1986 |
| GB | 2420662 | 5/2006 |
| JP | H11177151 A | 7/1999 |
| WO | 2006056809 A1 | 6/2006 |
| WO | WO 2006056809 A1 * | 6/2006 |
| WO | 2009126344 A2 | 10/2009 |

OTHER PUBLICATIONS

Kruglick, Ezekiel, U.S. Appl. No. 13/386,736, filed Jan. 24, 2012.

Kruglick, Ezekiel, U.S. Appl. No. 13/384,859, filed Jan. 19, 2012.

International Search Report dated Dec. 20, 2011 in PCT/US2011/052569.

International Search Report dated Dec. 21, 2011 in PCT/US2011/052577.

Neese, B. et al., "Large Electrocaloric Effect in Ferroelectric Polymers Near Room Temperature," Science 321, No. 5890, pp. 821-823 (2008) (Abstract only).

Akcay, G. et al., "Influence of mechanical boundary conditions on the electrocaloric properties of ferroelectric thin films," Journal of Applied Physics 103 (2008).

Epstein, R.I., "Photonic and Electronic Cooling," International Conference on Emerging Trends in Electronic and Photonic Devices & Systems, Electro '09, Dec. 2009.

Waller, D. et al., "The effect of pulse duration and oxygen partial pressure on La0.7Sr0.3CoO3- and La0.7Sr0.3Co0.2Fe0.8O3- films prepared by laser ablation," Solid State Ionics, vol. 134, No. 1, Oct. 1, 2000 , pp. 119-125(7).

Dames, C., "Solid-State Thermal Rectification with Existing Bulk Materials," Journal of Heat Transfer 131, No. 6 (2009).

Fett, T. et al., "Nonsymmetry in the Deformation Behaviour of PZT," Journal of Materials Science Letters 17, No. 4, pp. 261-265 (1998) (Abstract only).

Vereshchagina, Elizaveta, "Investigation of Solid-State Cooler Based on Electrocaloric Effect," MS Thesis, 2007.

Sebald, G. et al., "Pyroelectric Energy Conversion: Optimization Principles," IEEE Transactions on Ultrasonics, Ferroelectrics, and Frequency Control, vol. 55, No. 3, Mar. 2008.

International Search Report dated Aug. 11, 2011 in PCT/US2010/039200.

U.S. Office Action dated Mar. 16, 2012 in U.S. Appl. No. 12/999,684.

Ashley, S., "Cool Polymers: Toward the Microwave Over Version of the Refrigerator," Scientific America Magazine Printed Apr. 7, 2009 [http://www.sciam.com/article.cfm?id=cool-polymers&print=true].

Mischenko, A. et al., "Giant Electrocaloric Effect in Thin-Film PPbZr0.95Ti0.05O3" Science, vol. 311 Downloaded Oct. 21, 2009 [www.sciencemag.org] Aug. 8, 2008, pp. 821-823.

Seim, H. et al., "Growth of LaCoO3 Thin Films from β-diketonate precursors," Applied Surface Science, vol. 112, 1997 pp. 243-250.

International Search Report dated Jun. 4, 2011 in PCT/US2011/033220.

Kobayahi, et al., "An Oxide Thermal Rectifier"; http://arxiv.org/abs/0910.1153; Oct. 7, 2009.

Terraneo et al., "Controlling the Energy Flow in Nonlinear Lattices: A Model for a Thermal Rectifier"; Physical Review Letters, vol. 88, No. 9, Mar. 4, 2002.

Peyrard, M., "The Design of a Thermal Rectifier"; Europhysics Letters vol. 76, No. 49; (2006).

Morita et al., "Ferroelectric Properties of an Epitaxial Lead Zirconate Titanate Thin Film Deposited by a Hydrothermal Method Below the Curie Temperature"; Applied Physics Letters, vol. 84, No. 25, Jun. 21, 2004.

Li et al., "Interface Thermal Resistance Between Dissimilar Anharmonic Lattices"; Physics Review Letters, vol. 95, 104302 (2005).

International Search Report & Written Opinion dated Oct. 15, 2012 in PCT Application No. PCT/US12/47013.

U.S. Office Action dated Aug. 2, 2012 in U.S. Appl. No. 12/999,684.

Arik, Mehmet, "Enhancement of Pool Boiling Critical Heat Flux in Dielectric Liquids by Microporous Coatings," International Journal of Heat and Mass Transfer, 2007, pp. 997-1009, vol. 50.

Takeshi M., et al., "Ferroelectric properties of an epitaxial lead zirconate titanate thin film deposited by a hydrothermal method below the Curie temperature," Applied Physics Letters, vol. 84, Issue: 25, Jun. 21, 2004, pp. 5094-5096.

"Heat Diode Paves the Way for Thermal Computing," Technology Review, accessed at [http://www.technologyreview.com/blog/arxiv/24222/?a=f] Oct. 2009.

International Search Report & Written Opinion dated Nov. 12, 2010 in PCT Application No. PCT/US10/47887.

Arik, Mehmet, "Enhancement of Pool Boiling Critical Heat Flux in Dielectric Liquids," Doctoral Dissertation submitted to University of Minnesota, Feb. 2001.

Salam, et al., "Pressure Drop Measurements in a Low Pressure Steam Condenser with a Horizontal Bundle of Staggered Tubes," Applied Thermal Engineering, 2004, pp. 1365-1379, vol. 24.

U.S. Notice of Allowance dated Jan. 27, 2014 in U.S. Appl. No. 13/386,736.

U.S. Notice of Allowance dated Jan. 30, 2014 in U.S. Appl. No. 12/999,182.

(56) References Cited

OTHER PUBLICATIONS

Surana, R., "High Strain Functionally Graded Barium Titanate and its Mathematical Characterization," A dissertation submitted to the Division of Research and Advanced Studies of the University of Cincinnati, Sep. 27, 2004, pp. 1-104.
Lankford, K., "Spacecraft Thermal Control Handbook," Chapter 10, Heat Switches, 2002, pp. 353-371.
Sharpe, W.N. Jr. and Sharpe, W. I., "Springer Handbook of Experimental Solid Mechanics," Atomic Force Microscopy in Solid Mechanics, Part B, Chapter 17.2.5 PZT Actuator Nonlinearities, Dec. 4, 2008, pp. 420-423 (http:tinyurl.com/2bg6zkt).
U.S. Official Action dated Nov. 7, 2013 in U.S. Appl. No. 13/384,859.
U.S. Official Action dated Sep. 12, 2013 in U.S. Appl. No. 13/386,736.
U.S. Official Action dated Aug. 29, 2013 in U.S. Appl. No. 12/999,182.
"Thermal Analysis of Semiconductor Systems," White Paper, Freescale Semiconductor, Inc., accessed at http://www.freescale.com/files/analog/doc/white_paper/BasicThermalWP.pdf, p. 24 (2008).
International Search Report and Written Opinion for International Application No. PCT/US2012/055872 mailed on Nov. 20, 2012.
Kim, S.B., et al., "Thermal disturbance and its impact on reliability of phase-change memory studied by the micro-thermal stage" IEEE International Reliability Physics Symposium (IRPS), pp. 99-103 (2010).
Lencer, D., et al., "Design Rules for Phase-Change Materials in beta Storage Applications," Advanced Materials, vol. 23, No. 18, pp. 2030-2058 (May 10, 2011).
Servalli, G., "A 45nm Generation Phase Change Memory Technology," IEEE International Electron Devices Meeting, pp. 1-4 (Dec. 7-9, 2009).
Chinese First Office Action dated Apr. 7, 2015 as received in Application No. 201180073606.2.
Chinese First Office Action dated Apr. 9, 2015 as received in Application No. 201180073616.6.
Final Office Action mailed Jul. 16, 2014 in U.S Appl. No. 13/384,859, Ezekiel Kruglick, filed Jan. 19, 2012.
International Preliminary Report on Patentability for PCT application No. PCT/US2010/039200 mailed on Dec. 19, 2012.
International Preliminary Report on Patentability for PCT application No. PCT/US2010/047887 mailed on Mar. 5, 2013.
International Preliminary Report on Patentability for PCT application No. PCT/US2011/052569 mailed on Mar. 25, 2014.
International Preliminary Report on Patentability for PCT application No. PCT/US2011/033220 mailed on Oct. 22, 2013.
International Preliminary Report on Patentability for PCT application No. PCT/US2011/052577 mailed on Mar. 25, 2014.
International Preliminary Report on Patentability for PCT application No. PCT/US2012/047013 mailed on Jan. 20, 2015.
Non Final Office Action mailed Jan. 13, 2015 in U.S. Appl. No. 13/813,588, Ezekiel Kruglick, filed Jan. 31, 2013.
Non-Final OA mailed Aug. 16, 2013, in U.S. Appl. No. 12/999,182, Ezekiel Kruglick, filed Dec. 15, 2010.
Supplementary European search report for EP2583320 mailed on dated Jan. 2, 2014.
Notice of Allowance mailed May 5, 2014 in U.S. Appl. No. 12/999,182, Ezekiel Kruglick, filed Dec. 15, 2010.
Sinyavskii, Y. V., "Electrocaloric Refrigerators: A Promising Alternative to Current Low-Temperature Apparatus," Chemical and Petroleum Engineering, vol. 31, No. 6, pp. 295-306 (Jan. 1, 1995).
U.S. Official Action dated Jun. 19, 2015 in U.S. Appl. No. 13/813,588.
U.S. Official Action dated Jun. 23, 2015 in U.S. Appl. No. 13/810,324.
Epstein et al., Electrocaloric Devices Based on Thin-Film Heat Switches, 2009 Journal of Applied Physics 106, 7pp.
Bai et al, Direct measurement of Giant Electrocaloric Effect in BaTiO3 Multilayer Thick Film Structure Beyond Theoreticlal Prediction, 2010 Applied Physics Letters 96, 3pp.
US 6,105,361, 08/2000, Ghoshal (withdrawn)

\* cited by examiner

HETEROGENEOUS ELECTROCALORIC EFFECT HEAT TRANSFER DEVICE

CROSS-REFERENCE TO RELATED APPLICATIONS

The present Application is a National Stage application filing under 35 USC §371 of International Application PCT/US11/33220, filed on Apr. 20, 2011. This application is related to co-pending application Ser. No. PCT/US2010/039200, entitled, "Electrocaloric Effect Materials and Thermal Diodes," filed on 18 Jun. 2010, and corresponding U.S. National Stage filing, application serial number 12/999,684, entitled "Electrocaloric Effect Materials and Thermal Diodes," filed on 17 Dec. 2010, each of which is herein incorporated by reference in its entirety.

BACKGROUND

Unless otherwise indicated herein, the materials described in this section are not prior art to the claims in this application and are not admitted to be prior art by inclusion in this section.

Electrocaloric effect materials are materials that experience a temperature change when subjected to an applied voltage. This temperature change is reversible upon the removal of the applied voltage. By physically connecting and disconnecting electrocaloric effect material to and from a heat source, and creating a unidirectional heat transfer path, a heat pump can be created for transferring heat away from the heat source.

The present disclosure appreciates that the electrocaloric effect and other materials used in various types of heat pumps may experience various performance efficiencies at various operating temperatures. As a result, the performance of an electrocaloric effect material heat pump may undesirably change throughout the operating temperature range of a heat source to which the heat pump is thermally connected. Consequently, a conventional electrocaloric effect material heat pump may not be suitable for use with a heat source operating within a relatively wide temperature range.

SUMMARY

The present disclosure generally describes techniques for electrocaloric effect heat transfer devices and methods effective to facilitate heat transfer over a wide operating temperature range of a corresponding heat source. According to some example embodiments, a heat transfer device may include multiple heat transfer stacks positioned adjacent to one another. Each heat transfer stack includes an electrocaloric effect material and a thermal rectifier in thermal contact with the electrocaloric effect material. The electrocaloric effect materials of at least two heat transfer stacks have different effective temperature ranges that when combined, encompass the operating temperature range of the heat source.

The present disclosure also generally describes methods for transferring heat from a heat source at any temperature within an operating temperature range of the heat source. Some methods may include applying an electric field across an electrocaloric effect material that is configured in thermal contact with the heat source at an operating temperature of the heat source. During the application of the electric field, heat can be transferred from the heat source to a heat dump through a thermal rectifier that is configured in thermal contact with the heat source and the electrocaloric effect material. At a different operating temperature of the heat source, an electric field can be applied across a second electrocaloric effect material that is configured in thermal contact with the heat source. During the application of the electric field, heat can be transferred from the heat source to the heat dump through a second thermal rectifier that is configured in thermal contact with the heat source and the second electrocaloric effect material.

The present disclosure further generally describes heat transfer systems. According to example embodiments, a heat transfer system may include a number of heat transfer stacks arranged in a coplanar array. The array may have two heat transfer stacks with varying effective temperature ranges. Each heat transfer stack has an electrocaloric effect material, two or more electrodes positioned effective to apply an electric field across the electrocaloric effect material, and a thermal rectifier configured in thermal contact with the electrocaloric effect material. A controller configured to selectively apply the electric field to one or more heat transfer stacks according to an operating temperature of a heat source that is adapted in thermal contact with the array.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
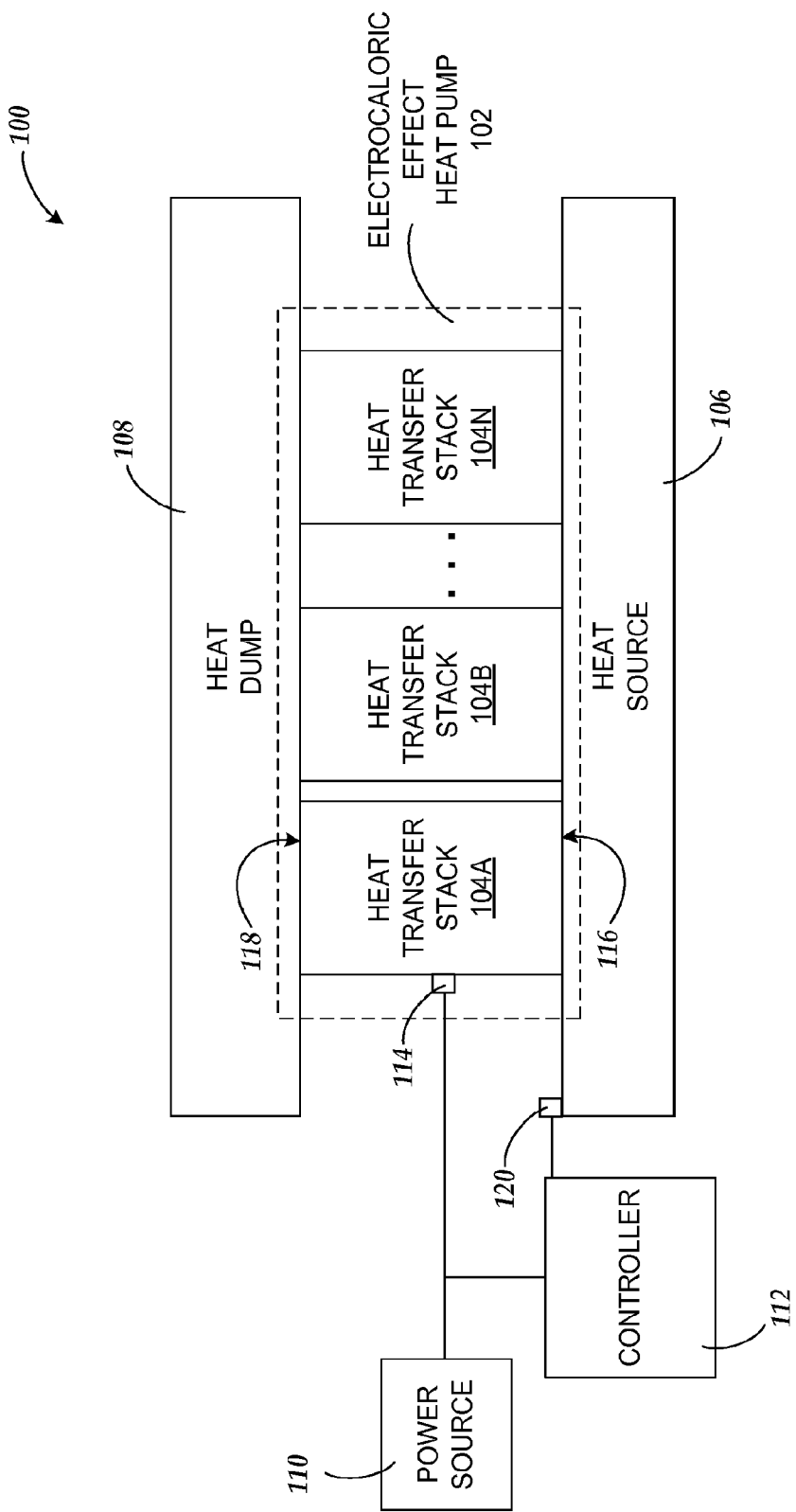
FIG. 1 is a functional block diagram illustrating an example electrocaloric effect heat pump system utilizing an electrocaloric effect heat pump having multiple heat transfer stacks.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to an electrocaloric effect heat pump capable of operating over a wide operating temperature range of a heat source to which the heat pump is coupled. In an illustrative implementation, an electrocaloric effect heat pump may be configured to utilize any number of rows and columns of heat transfer stacks. Each heat transfer stack may include alternating layers of electrocaloric effect material and thermal rectifier. While a single electrocaloric effect material may be used for each electrocaloric effect material layer of a single heat transfer stack, the electrocaloric effect material utilized within adjacent heat transfer stacks may differ, resulting in adjacent heat transfer stacks having dissimilar effective temperature ranges. The electrocaloric effect material utilized in each heat transfer stack may be selected such that the combined effective temperature ranges of the heat transfer stacks encompass the desired operating temperature range of the heat source to be cooled.

Electrocaloric effect materials, as well as thermal rectifiers, may have variable performance capabilities at different temperatures. Consequently, a heat transfer stack that includes alternating layers of electrocaloric effect material and thermal rectifier may be adapted for a particular temperature range depending on the selection of electrocaloric effect and thermal rectifier materials. For the purposes of this disclosure, the term "effective temperature range" with respect to the heat transfer stacks encompasses a range of temperatures in which the corresponding electrocaloric effect material and/or thermal rectifier within the heat transfer stack is effective to approximately maximize the heat transfer capabilities of the stack. The configuration of heat transfer stacks with dissimilar effective temperature ranges create a heterogeneous electrocaloric effect heat transfer device that is operative over a wide operating temperature range of the corresponding heat source.

FIG. 1 is a functional block diagram illustrating an example electrocaloric effect heat pump system 100 utilizing an electrocaloric effect heat pump 102 having multiple heat transfer stacks 104A-104N, arranged in accordance with at least some embodiments described herein. Heat transfer stacks 104A-104N may collectively be referred to as "104". One surface 116 of the electrocaloric effect heat pump 102 is thermally coupled to a heat source 106 to be cooled. An opposing surface 118 of the electrocaloric effect heat pump 102 is thermally coupled to a heat dump 108, which receives heat transferred from the heat source 106 by the electrocaloric effect heat pump 102. The thermal coupling may include direct surface-to-surface contact between the electrocaloric effect heat pump 102 and the heat source 106, as well as between the electrocaloric effect heat pump 102 and the heat dump 108, with or without a physical connection or coupling of the components. Alternatively, any other intervening components may be utilized to thermally couple the electrocaloric effect heat pump 102 to the heat source 106 and to the heat dump 108, provided that the intervening components provide a thermally conductive path that facilitates heat transfer between the components of the electrocaloric effect heat transfer system 100. Other example intervening components may include, but are not limited to, thermal grease or paste, thermally conductive adhesives and adhesive tapes, thermally conductive shims, and solder.

The electrocaloric effect heat pump 102 is electrically coupled to a power source 110 via one or more electrodes 114. It should be appreciated that although the electrodes 114 are represented in FIG. 1 as a single box or rectangle, implementations may include any number and type of electrodes 114 positioned appropriately throughout the electrocaloric effect heat pump 102 that are operable to subject the various electrocaloric effect material layers of the heat transfer stacks 104 to electrical fields provided by the power source 110. For example, as will be described in further detail below with respect to FIG. 2, each heat transfer stack 104 includes alternating layers of electrocaloric effect material and thermal rectifier. According to one implementation, two electrodes 114 may be positioned on opposing sides of the electrocaloric effect material layer, optionally encompassing an adjacent thermal rectifier layer. The electrodes 114 are further described and illustrated in application serial number PCT/US2010/039200, entitled, "Electrocaloric Effect Materials and Thermal Diodes," filed on 18-Jun.-2010, and corresponding U.S. National Phase filing, U.S. application Ser. No. 12/999,684, entitled "Electrocaloric Effect Materials and Thermal Diodes," filed on 17-Dec.-2010, each of which is herein incorporated by reference in its entirety.

In some examples, an electrode control signal may be applied to the electrodes 114 from the power source 110 effective to generate an electric field across the associated electrocaloric effect material. The electrode control signal may be any type of signal that is effective to produce the desired temperature change within the electrocaloric effect material and corresponding heat pumping action that transfers heat away from the heat source 106. According to one implementation, the electrode control signal may be an oscillating voltage. The oscillating voltage may be provided as any of a variety of voltage waveforms. In some examples, the oscillating voltage may be provided as a pulsed signal with a direct current (DC) voltage of specified amplitude that is pulsed on or off (or simply between an upper voltage and lower voltage) with a specified duty cycle and period. In some additional examples, the oscillating voltage may be provided as a sinusoidal signal with an alternating current (AC) voltage of a specified amplitude, frequency, phase and DC offset. In still additional examples, the oscillating voltage may be provided as a ramped or sawtooth signal with a specified amplitude, rate, period and DC offset. In still other examples, the oscillating voltage may be provided as a triangular signal with a specified amplitude, first ramp rate (e.g., increasing), second ramp rate (e.g., decreasing), period, and DC offset. Additional waveforms or combinations of waveforms are also contemplated.

The electrocaloric effect heat transfer system 100 may include a controller 112 that is operative to control the electrode control signal applied to the electrodes 114 from the power source 110 to create the desired electric fields that drive the heat transfer through the system. The controller 112 may be operative to control the application of the electrode control signal according to an operating temperature of the heat source 116, as detected with a temperature sensor 120 that may be communicatively coupled to the controller 112. Examples of the types of temperature sensors 120 may include, but are not limited to, diode-based sensors, proportional to absolute temperature (PTAT) circuits, bi-metal junctions, and metal film resistivity sensors. The controller 112 may include any type of computer hardware and/or software capable of providing the electrode control signal at the desired waveform characteristics according to, inter cilia, the electrocaloric effect material used. The controller 112 may be included as part of the electrocaloric effect heat pump 102, or may be an external component of the electrocaloric effect heat transfer system 100 as shown in FIG. 1. The controller 112, as arranged in accordance with at least some embodiments will be described in greater detail below with respect to FIG. 8.

It should be appreciated that the heat source 106 may be any electronic component, computer component, appliance, or any device that may generate or absorb heat during operation. Similarly, the heat dump 108 may include any thermally conductive material such as a metal or metal alloy heat sink material. In some examples, the heat dump 108 may be comprised of a computer case or an electronics case that is thermally conductive material capable of receiving heat from the electrocaloric effect heat pump 102 at any operating temperature of the heat source 106. Alternatively, rather than including a metal or other solid material, the heat dump 108 may include gas or liquid. In some implementations, the heat dump 108 may include both conductive material and liquid or gas such as a heat pipe apparatus where the inside of the heat pipe may be comprised of liquid/gas and the exterior of the heat pipe is a metal alloy. Additional combinations of thermally conductive materials, liquids and gases are contemplated. Example thermally conductive materials may include, but are not limited to, aluminum, copper, silver, gold, platinum, tungsten, and other metal or metal alloys. Although less thermally conductive than the metal and metal alloys described above, other materials that are suitable for high temperatures, such as ceramics, are also contemplated. Example gases suitable for the present application may include air, nitrogen, helium, and other gases. Noncorrosive gases may be suitable for the present application, including multi-component gas mixtures such as a Helium-Xenon mixture. Example liquids suitable for the present application gases include water, liquid nitrogen, liquid helium, ethylene glycol, alcohol, and ionic liquids.

Figure 2:
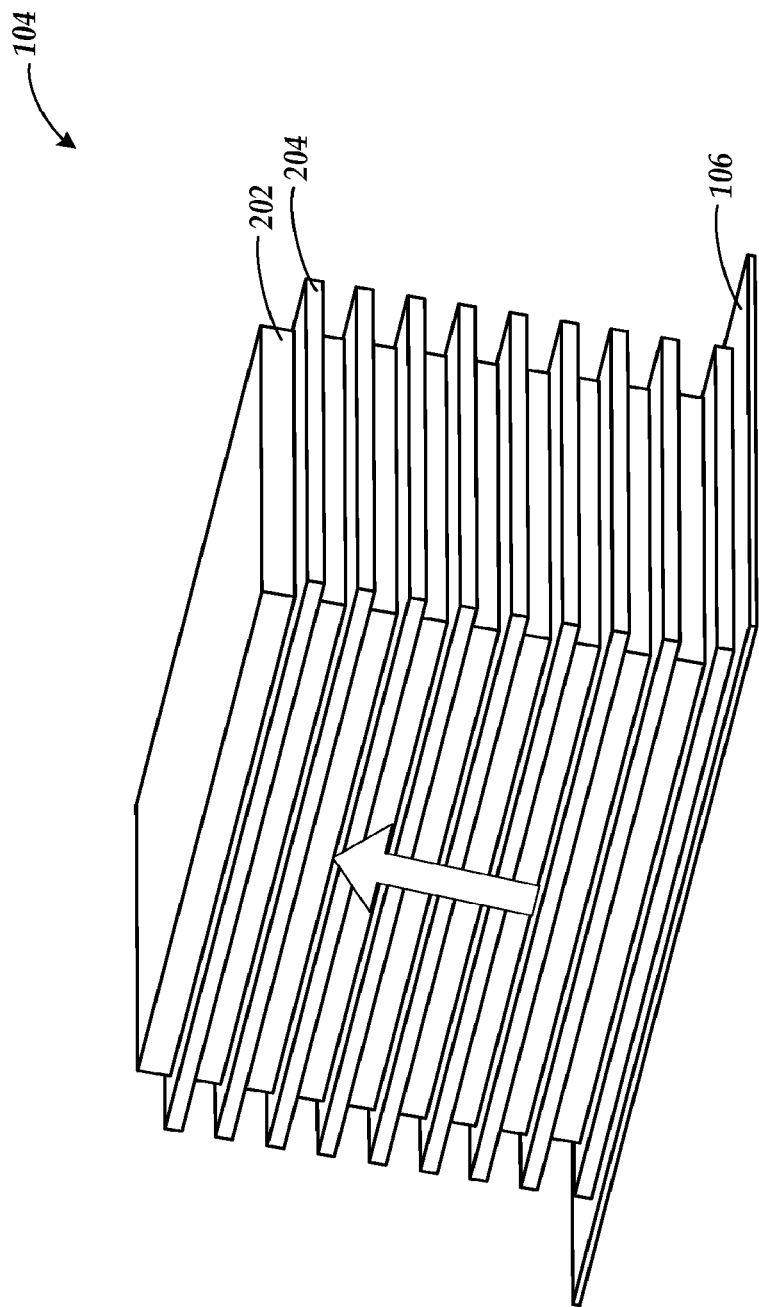
FIG. 2 is a perspective view of an example heat transfer stack of an electrocaloric effect heat pump system.

FIG. 2 is a perspective view of an example heat transfer stack 104 of an electrocaloric effect heat pump system 100, arranged in accordance with at least some embodiments described herein. The heat transfer stack 104 may be thermally coupled to a heat source 106. According to this example, the heat transfer stack 104 includes alternating layers of electrocaloric effect material 202 and thermal rectifier 204. A layer of thermal rectifier 204 may be positioned between the heat source 106 and the first layer of electrocaloric effect material 202 such that a first surface of the thermal rectifier 204 abuts a surface of the heat source 106, and an opposing second surface of the thermal rectifier 204 abuts a surface of the first layer of electrocaloric effect material 202. In this manner, the first layer of electrocaloric effect material 202 is in indirect thermal contact with the heat source 106 and direct thermal contact with the thermal rectifier 204. Alternatively, it should be appreciated that any thermally conductive compound may intervene between the first layer of electrocaloric effect material 202 and the heat source 106, between the first layer of thermal rectifier 204 and the heat source 106, or between the first layer of thermal rectifier 204 and the first layer of electrocaloric effect material 202. Examples include, but are not limited to, a silver gel compound, copper plate, thermal grease or paste, thermally conductive adhesives and adhesive tapes, solder, and/or any type of thermally conductive shim. As an oscillating voltage or other electrode control signal is supplied to the layers of electrocaloric effect material 202, heat can be transferred away from the heat source 106 and through the layers of the heat transfer stack 104.

The electrocaloric effect material 202 may include any suitable electrocaloric effect material that experiences a temperature change upon an application of an applied voltage. As will be described in greater detail below with respect to FIGS. 3-5, the electrocaloric effect material 202 used within the various heat transfer stacks 104 may be selected according to the operating temperature range of the heat source 106 so that the total aggregated effective temperature ranges of the heat transfer stacks 104 may encompass approximately the desired operating temperature range of the heat source 106. Various implementations may include combined effective temperature ranges of the various heat transfer stacks 104 that encompass the total operating temperature range of the heat source 106 or of a desired portion of the operating temperature range of the heat source 106. Moreover, the electrocaloric effect material 202 may be substantially homogenous throughout the various layers of a single heat transfer stack 104 in that each layer may include the same characteristics, including but not limited to the type of electrocaloric effect material, as well as the layer dimensions and shape. Alternatively, the electrocaloric effect material 202 layers may differ in any characteristics within a single heat transfer stack 104.

The thermal rectifier 204, or thermal diode, may have an asymmetrical thermal conductance characteristic, in that heat may be transported more readily in one general direction than in another, as indicated by the open arrow in FIG. 2. Another way of stating the heat transfer characteristic of the thermal rectifier 204 is that the thermal rectifier 204 may be configured to resist heat transfer in a direction from the heat dump 108 to the heat source 106 after removal of the electric field from the corresponding heat transfer stack 104. Although for clarity purposes, each layer of the thermal rectifier 204 is illustrated as a uniform sheet, it should be appreciated that according to various implementations, the thermal rectifier 204 may include any quantity of suitable materials having different temperature coefficients of thermal conductivity. The materials having different temperature coefficients of thermal conductivity may be configured in thermal contact with one another, or may utilize heat pipes, actuators, or any other implementation that allows heat to more readily flow in one direction than the other. Moreover, similar to the electrocaloric effect material 202 discussed above within a single heat transfer stack 104, the thermal rectifier 204 characteristics may be substantially homogenous throughout the various layers of a single heat transfer stack 104 in that each thermal rectifier layer may include the same characteristics as other thermal rectifier layers, including but not limited to the type of thermal rectifier material, as well as the layer dimensions and shape. Alternatively, the thermal rectifier 204 layers may differ in any characteristics within a single heat transfer stack 104.

The precise characteristics of a single heat transfer stack 104 may vary according to the desired heat pump performance for the particular implementation. For example, the electrocaloric effect material 202, the materials used within the thermal rectifier 204, the positioning of the electrodes 114 and corresponding voltage application, and the method of creating a heat transfer stack 104 and associated layers may vary according to any number and type of heat pump performance criteria associated with the particular implementation.

These heat transfer stack characteristics and others are described in application serial number PCT/US2010/039200, entitled, "Electrocaloric Effect Materials and Thermal Diodes," filed on 18 Jun. 2010, and corresponding U.S. National Phase filing, U.S. application Ser. No. 12/999,684, entitled "Electrocaloric Effect Materials and Thermal Diodes," filed on 17 Dec. 2010, each of which is herein incorporated by reference in its entirety.

Figure 3:
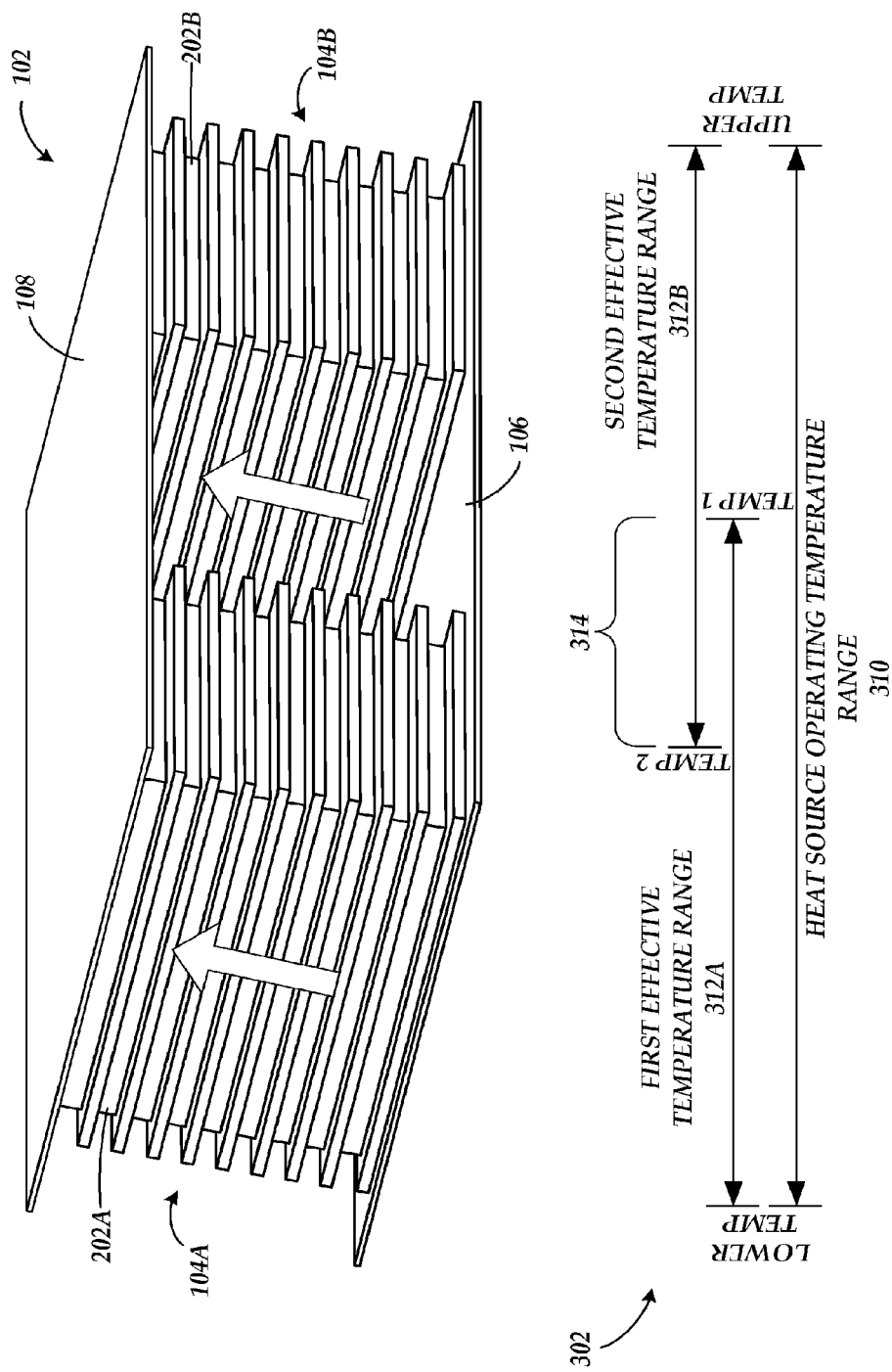
FIG. 3 is a perspective view of an example electrocaloric effect heat pump and a corresponding operating temperature range diagram illustrating a use of multiple heat transfer stacks with differing electrocaloric effect materials to cool a heat source over a wide operating temperature range.

FIG. 3 is a perspective view of an example electrocaloric effect heat pump 102 and a corresponding operating temperature range diagram 302 illustrating a use of multiple heat transfer stacks 104 with differing electrocaloric effect materials 202 to cool a heat source 106 over a wide operating temperature range, arranged in accordance with at least some embodiments described herein. The open arrows on the heat transfer stacks 104 are shown to illustrate a general direction for the transfer of heat from the heat source 106 to the heat dump 108. According to this example implementation of the electrocaloric effect heat pump 102, the heat pump includes two heat transfer stacks 104A and 104B. A first heat transfer stack 104A may include a first electrocaloric effect material 202A that is adapted to operate within a first effective temperature range 312A (effective temperature ranges generally referred to as "312"). As can be seen with the operating temperature range diagram 302, the first effective temperature range 312A does not necessarily encompass a desired heat source operating temperature range 310. Rather, the first effective temperature range 312A may span from a lower temperature of the heat source operating temperature range 310 to a first temperature within the heat source operating temperature range 310. Similarly, the second heat transfer stack 104B may include a second electrocaloric effect material 202B that is adapted to operate within a second effective temperature range 312B that also does not necessarily encompass the desired heat source operating temperature range 310. The second effective temperature range 312B may span from a second temperature within the heat source operating temperature range 310 to an upper temperature of the heat source operating temperature range 310.

However, because the example electrocaloric effect heat pump 102 includes both the first and second heat transfer stacks 104A and 104B with varying effective temperature ranges 312 that together may create a combined effective temperature range that may encompass the desired heat source operating temperature range 310, the electrocaloric effect heat pump 102 is capable of transferring heat at substantially any operating temperature of the heat source 106. As will be described in greater detail below with respect to FIGS. 4 and 5, when the operating temperature of the heat source 106 is within the first effective temperature range 312A, the first heat transfer stack 104A is effective to transfer heat from the heat source 106 to the heat dump 108, while the second heat transfer stack 104B may remain inoperative or less effective. The neutrality or ineffectiveness of the second heat transfer stack 104B may be due to a selective removal of the electric field, or predetermined exclusion of the electric field, from the second heat transfer stack 104B while the operating temperature of the heat source 106 may be outside of the second effective temperature range 312B.

When the operating temperature of the heat source 106 rises into the second effective temperature range 312B associated with the second heat transfer stack 104B, then the controller 112 may be adapted to effectively remove the electric field from the first heat transfer stack 104A and effectively apply the electric field to the second heat transfer stack 104B so that the heat transfer operations shift from the first heat transfer stack 104A to the second heat transfer stack 104B. Alternatively, the controller 112 may be configured to maintain the application of the electric field to both heat transfer stacks 104A and 104B substantially simultaneously, where the heat transfer stack 104 associated with the effective temperature range 312 that encompasses the current operating temperature of the heat source 106 remains effective.

According to the example illustrated by the operating temperature range diagram 302 of FIG. 3, there may be an overlapping temperature range 314 that represents a range of temperatures in which both the first heat transfer stack 104A and the second heat transfer stack 104B are effective. At operating temperatures within the overlapping temperature range 314, the controller 112 may be configured to effectively provide the electric field to both of the heat transfer stacks 104A and 104B so that heat can be transferred from the heat source 106, through both heat transfer stacks 104A and 104B, to the heat dump 108 as indicated by the open arrows positioned on the electrocaloric effect heat pump 102. Operation of the heat source 106 within this overlapping temperature range 314 may increase the heat transfer capabilities of the electrocaloric effect heat pump 102 since all heat transfer stacks 104 may be operating efficiently. For this reason, the operating characteristics of the heat source 106, particularly the operating temperatures of the heat source 106, can be taken into consideration during the selection of the electrocaloric effect materials 202 and thermal rectifier 204 used within the heat transfer stacks 104 of a electrocaloric effect heat pump 102. As will also become clear from the disclosure herein, any number of heat transfer stacks 104 may be used with any number and type of electrocaloric effect materials 202 and thermal rectifier 204 with any given electrocaloric effect heat pump 102 in order to optimize the effective temperature ranges 312 and overlapping temperature ranges 314 according to the particular implementation.

Figure 4:
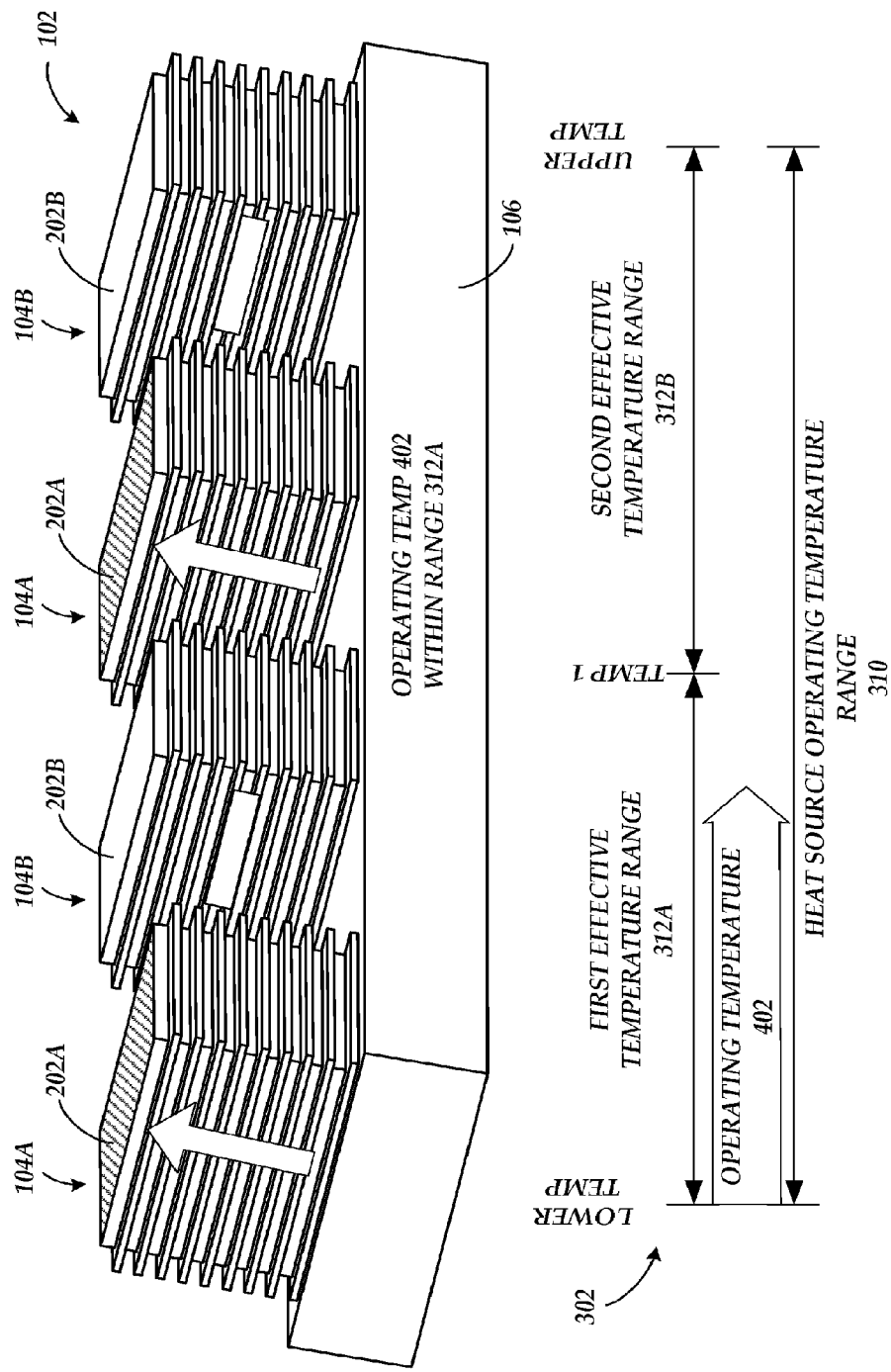
FIG. 4 is a perspective view of an example electrocaloric effect heat pump and a corresponding operating temperature range diagram illustrating the operation of heat transfer stacks at an operating temperature within an effective temperature range of a first electrocaloric effect material.

FIG. 4 is a perspective view of an example electrocaloric effect heat pump 102 and a corresponding operating temperature range diagram 302 illustrating the operation of heat transfer stacks 104 at an operating temperature 402 within an effective temperature range 312A of a first electrocaloric effect material 202A, arranged in accordance with at least some embodiments described herein. According to this example, the electrocaloric effect heat pump 102 includes one row of four heat transfer stacks 104. As stated above, it should be understood that the electrocaloric effect heat pump 102 is not limited to any number of heat transfer stacks 104 and that the number of heat transfer stacks 104 shown in FIG. 4 and the other drawings are chosen for illustrative purposes only.

Out of the four heat transfer stacks 104 shown, two heat transfer stacks will be referred to as first heat transfer stacks 104A because they are manufactured with a first electrocaloric effect material 202A. The other two heat transfer stacks will be referred to as second heat transfer stacks 104B because they are manufactured with a second electrocaloric effect material 202B. The first heat transfer stacks 104A may operate efficiently within the first effective temperature range 312A, while the second heat transfer stacks 104B may operate efficiently within the second effective temperature range 312B. For clarity purposes, it should be noted that there is no overlapping temperature range as described above. Rather, the first effective temperature range 312A spans between a lower temperature of the heat source operating temperature range 310 and a first temperature within the heat source operating temperature range 310, while the second effective temperature range 312B begins at the first temperature and spans to the upper temperature of the heat source operating temperature range 310. In this manner, the first effective temperature range 312A and the second effective temperature range 312B may aggregate to encompass approximately the entire heat source operating temperature range 310.

In this example, the current operating temperature 402 is shown within the operating temperature range diagram 302 as being within the first effective temperature range 312A associated with the first electrocaloric effect material 202A. According to one implementation, the controller 112 may be adapted to detect the operating temperature 402. In response, the controller 112 may be configured to select the first heat transfer stacks 104A for activation since the operating temperature 402 falls within the first effective temperature range 312A. The controller 112 may then be configured to provide the electric field to the corresponding electrodes 114 of the first heat transfer stacks 104A to initiate the heat transfer away from the heat source 106, as indicated by the open arrows. For clarity, the heat dump 108 is not shown in FIG. 4.

The open dash depicted on the second heat transfer stacks 104B indicates that these stacks are may remain inactive, or minimally effective, during this period in which the operating temperature 402 is outside of the second effective temperature range 312B. As mentioned above, according to one embodiment, the controller 112 may not be configured to provide the electric field to the heat transfer stacks 104 with effective temperature ranges 312 that do not encompass the current operating temperature 402. According to another embodiment, the controller 112 is configured to provide the electric field to all heat transfer stacks 104 at approximately all operating temperatures 402, but the heat transfer stacks 104 associated with an effective temperature range that does not encompass the current operating temperature 402 may be minimally effective.

Figure 5:
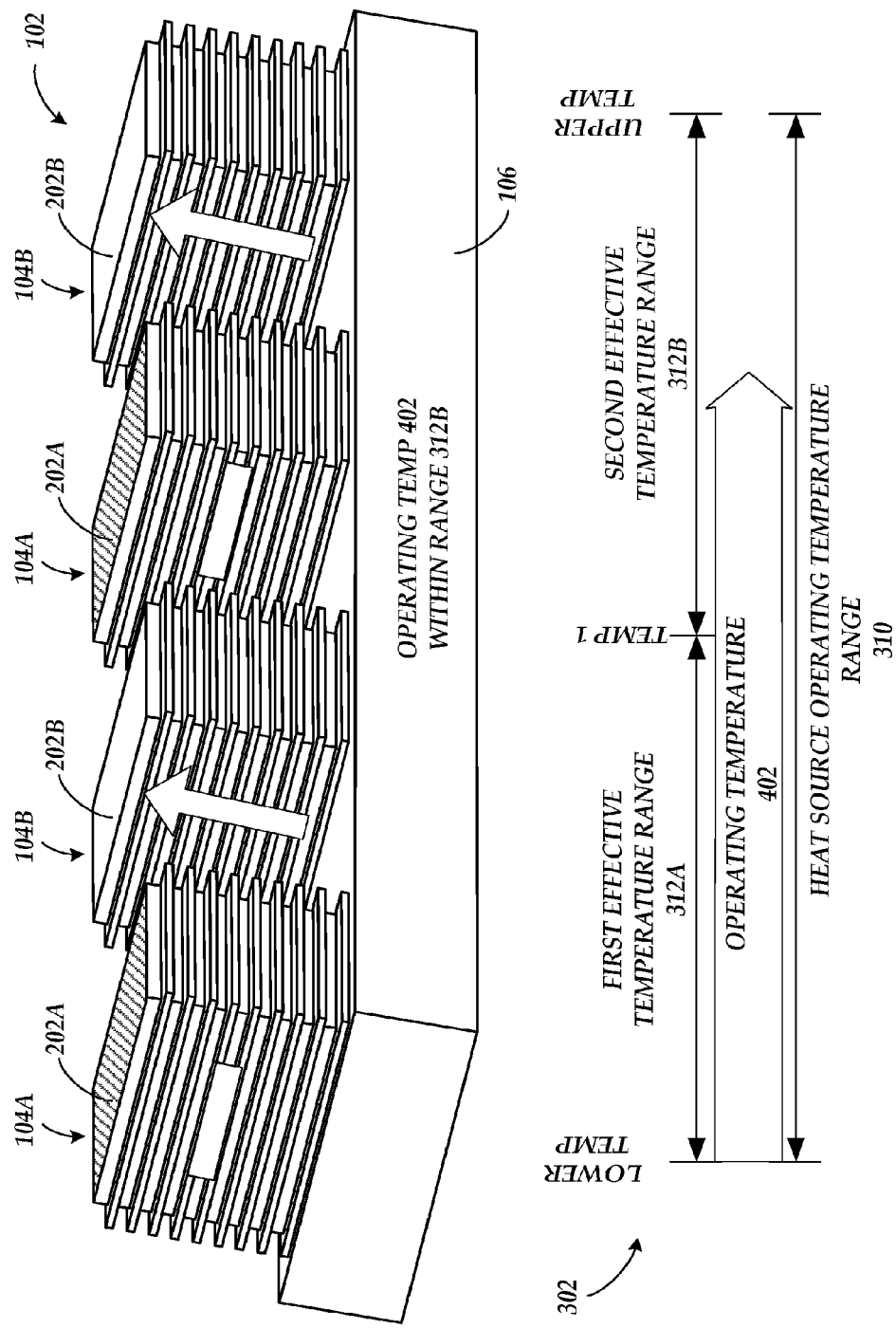
FIG. 5 is a perspective view of the example electrocaloric effect heat pump and operating temperature range diagram of FIG. 4 illustrating the operation of the heat transfer stacks at an operating temperature within an effective temperature range of a second electrocaloric effect material.

FIG. 5 is a perspective view of the example electrocaloric effect heat pump 102 and operating temperature range diagram 302 of FIG. 4 illustrating the operation of the heat transfer stacks 104 at an operating temperature 402 within an effective temperature range 312B of a second electrocaloric effect material 202B, arranged in accordance with at least some embodiments described herein. Continuing the example from FIG. 4, after the current operating temperature 402 moved into the second effective temperature range 312B, the controller 112 is configured to activate the second heat transfer stacks 104B and deactivate the first heat transfer stacks 104A. In doing so, the controller 112 may be configured to discontinue the electrode control signal to the first heat transfer stacks 104A and provide the electrode control signal to the corresponding electrodes 114 of the second heat transfer stacks 104B to initiate the heat transfer away from the heat source 106. This operational shift from the first heat transfer stacks 104A to the second heat transfer stacks 104B is represented by the repositioning of the open arrows and open dashes on the respective heat transfer stacks 104 from FIG. 4 to FIG. 5.

Figure 6:
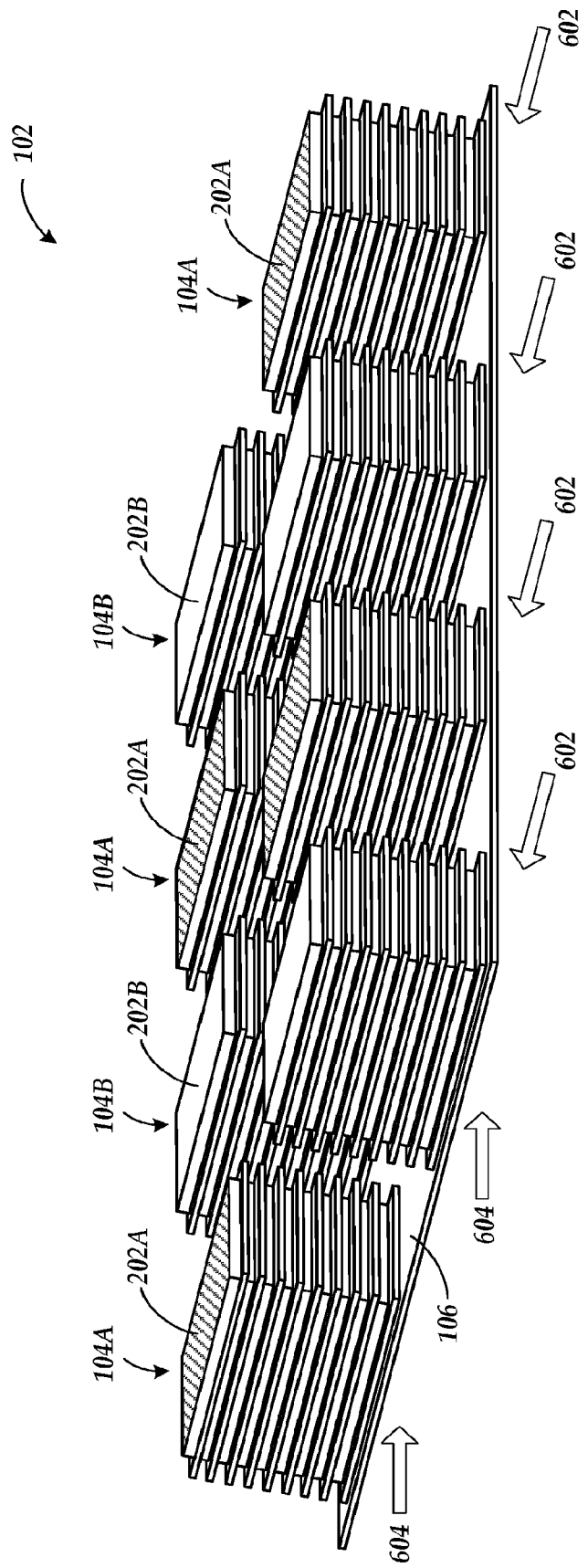
FIG. 6 is a perspective view of an example electrocaloric effect heat pump with an array of alternating heat transfer stacks configured in multiple columns and rows.

FIG. 6 is a perspective view of an example electrocaloric effect heat pump 102 with an array of alternating heat transfer stacks 104 configured in multiple columns 602A-602D and rows 604A and 604B, arranged in accordance with at least some embodiments described herein. As discussed above, an electrocaloric effect heat pump 102 may be constructed using any number of heat transfer stacks 104. The term "array" may be construed as containing two or more heat transfer stacks 104 arranged according to a pattern or other organized configuration. In this example, the array may include eight heat transfer stacks 104 arranged in four columns 602A-602D and two rows 604A and 604B. The columns 602A-602D may collectively be referred to as "602" and the rows 604A and 604B may collectively be referred to as "604." Of the eight heat transfer stacks 104, there may be two types of stacks, 104A and 104B, corresponding to the two types of electrocaloric effect material 202A and 202B, respectively, that they contain. For illustrative purposes, the top surface of the heat transfer stacks 104A containing electrocaloric effect material 202A have been hatched to more clearly illustrate the alternating configuration in which the heat transfer stacks 104A and 104B have been arranged.

According to alternative implementations, the heat transfer stacks 104 may be positioned within the array according to any pattern or configuration. For example, groups of like heat transfer stacks 104, or heat transfer stacks 104 containing similar electrocaloric effect material 202, may be positioned adjacent to groups of dissimilar heat transfer stacks 104 according to an alternating pattern. One example (not shown) might include two heat transfer stacks 104A positioned adjacent to one another in positions 602A/604A and 602B/604A, followed by two heat transfer stacks 104B in positions 602C/604A and 602D/604A. The pattern would then alternate in row 604B with heat transfer stacks 104B in positions 602A/604B and 602B/604B, followed by two heat transfer stacks 104A in positions 602C/604B and 602D/604B. Another example might include four heat transfer stacks 104A placed in positions 602A/604A, 602B/604A, 602A/604B, and 602B/604B. This group would then be followed by four heat transfer stacks 104B in positions 602C/604A, 602D/604A, 602C/604B, and 602D/604B. It should be understood that the disclosed configurations are not limited to these examples, but rather any desired array configuration may be utilized to optimize the transfer of heat from the heat source 106 to the heat dump 108 over the entire heat source operating temperature range 310.

In addition to the various placement configurations of the heat transfer stacks 104 within the array discussed above, it should be understood that the disclosure herein is not limited to other configurations shown and described above. In particular, the electrocaloric effect heat pump 102 may include any number of electrocaloric effect materials 202. Although two heat transfer stacks 104A and 104B were shown and described with respect to electrocaloric effect materials 202A and 202B, it is contemplated that three or more electrocaloric effect materials could be used depending on the characteristics of the heat source 106 and the corresponding cooling requirements of the electrocaloric effect heat pump 102, coupled with any number and type of environmental factors, cost, reliability, and other considerations. Moreover, the distance between adjacent heat transfer stacks 104 may vary, as well as the shape and size of the heat transfer stacks 104. While the heat transfer stacks 104 are shown to be generally rectangular in plan view, the heat transfer stacks 104 may include any shape and size without departing from the scope of this disclosure.

Figure 7:
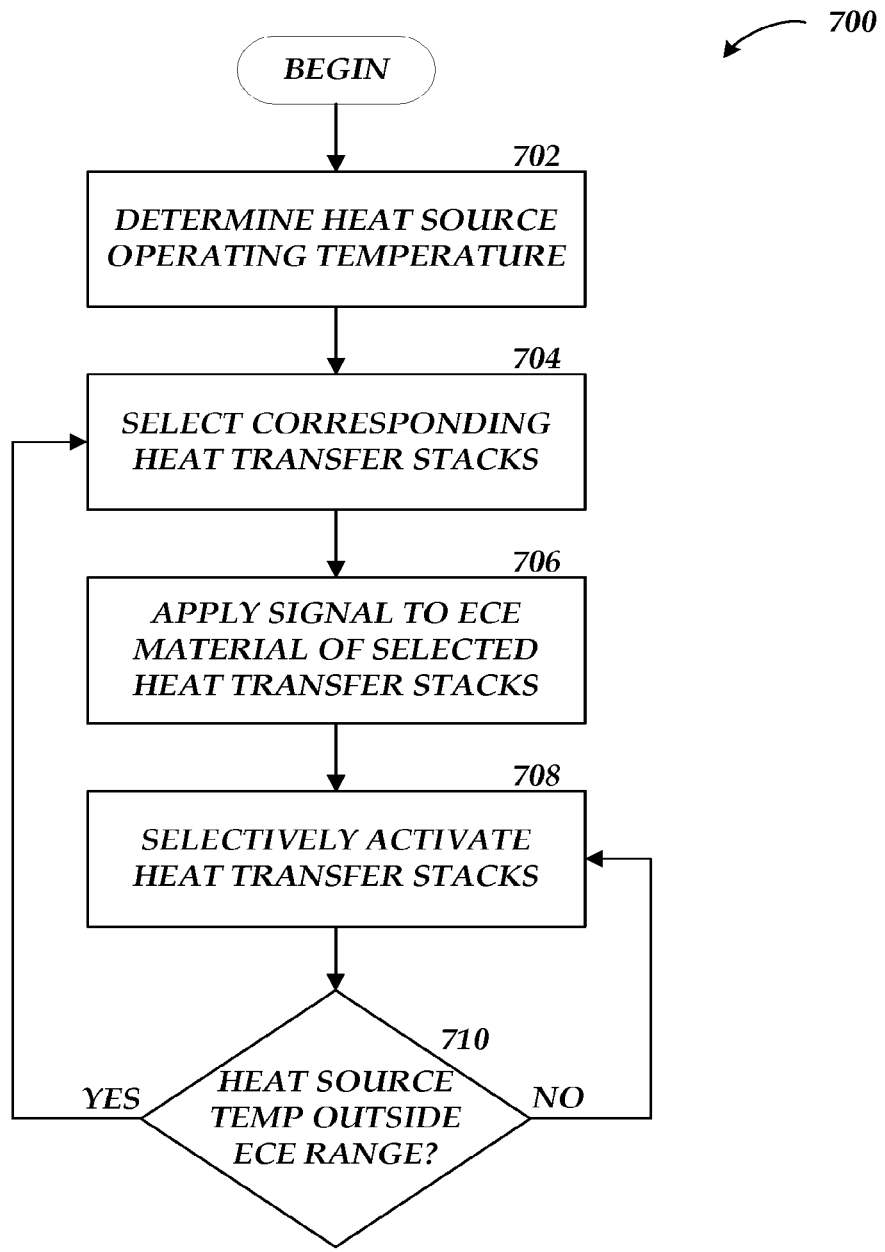
FIG. 7 is a flow diagram illustrating an example process for implementing an electrocaloric effect heat pump over a wide operating temperature range of a heat source.

FIG. 7 is a flow diagram illustrating an example process 700 for implementing an electrocaloric effect heat pump 102 over a wide operating temperature range 310 of a heat source 106, in accordance with at least some embodiments described herein. The process 700 may include various operations, functions, or actions as illustrated by one or more of blocks 702-710. It should be appreciated that more or fewer operations may be performed than shown in the FIG. 7 and described herein. Moreover, these operations may also be performed in a different order than those described herein.

The process 700 may begin at block 702 (Determine Heat Source Operating Temperature), where the controller 112 may be configured to determine the operating temperature 402 of the heat source 106. This determination may be made from feedback from the temperature sensor 120 that is arranged in thermal communication with the heat source 106. Block 702 may be followed by block 704.

At block 704 (Select Corresponding Heat Transfer Stacks), the controller 112 may be configured to determine an applicable subset of heat transfer stacks 104 for receiving the electrical field from the power source 110. This determination may be based on the effective temperature range(s) 312 that encompasses the current operating temperature 402 determined at block 702. As discussed above, there may be more than one electrocaloric effect material 202 with an effective temperature range 312 that encompasses the operating temperature 402, as illustrated by the overlapping temperature range 314. Moreover, in embodiments in which the controller 112 is configured to effectively control the application of the electrical field to all heat transfer stacks 104 at all operating temperatures 402, then the controller 112 may effectively select all heat transfer stacks during this operation. Block 704 may be followed by block 706.

At block 706 (Apply Electric Field to ECE Material of Selected Heat Transfer Stacks), the controller 112 may be configured to control the application of the electrode control signal from the power source 110 to the selected subset of heat transfer stacks 104 corresponding to the effective temperature ranges 312 that encompass the current operating temperature 402 of the heat source 106. As described above, the electrode control signal may include an oscillating voltage that is provided as any of a variety of voltage waveforms to alternately activate and deactivate the electrocaloric effect material 202 of the applicable heat transfer stacks 104. Block 706 may be followed by block 708.

At block 708 (Selectively Activate Heat Transfer Stacks), the electrocaloric effect material 202 of the applicable heat transfer stacks 104 may be effectively activated in response to the applied electric field, which initiates heat transfer away from the heat source 106 as described above. Because of the thermal rectifier 204 characteristics, a greater quantity of heat can be absorbed through the layers of thermal rectifier 204 closest to the heat source 106, resulting in a net heat flow through the heat transfer stack 104 away from the heat source 106. Block 708 may be followed by block 710.

At block 710 (Heat Source Temp Outside ECE Range?), the controller 112 is configured to determine via the temperature sensor 120 whether the current operating temperature 402 of the heat source 106 is outside of the effective temperature range 312 of the activated heat transfer stacks 104. If the operating temperature 402 is not outside of the effective temperature range 312 of the activated electrocaloric effect material 202, then the process 700 returns to block 708 and heat transfer continues. However, if the operating temperature 402 is outside of the effective temperature range 312 of the activated electrocaloric effect material 202, then the process 700 returns to block 704 and continues as described above. The process 700 continues until heat transfer from the heat source 106 is no longer needed and/or the electrocaloric effect heat pump 102 is deactivated.

Figure 8:
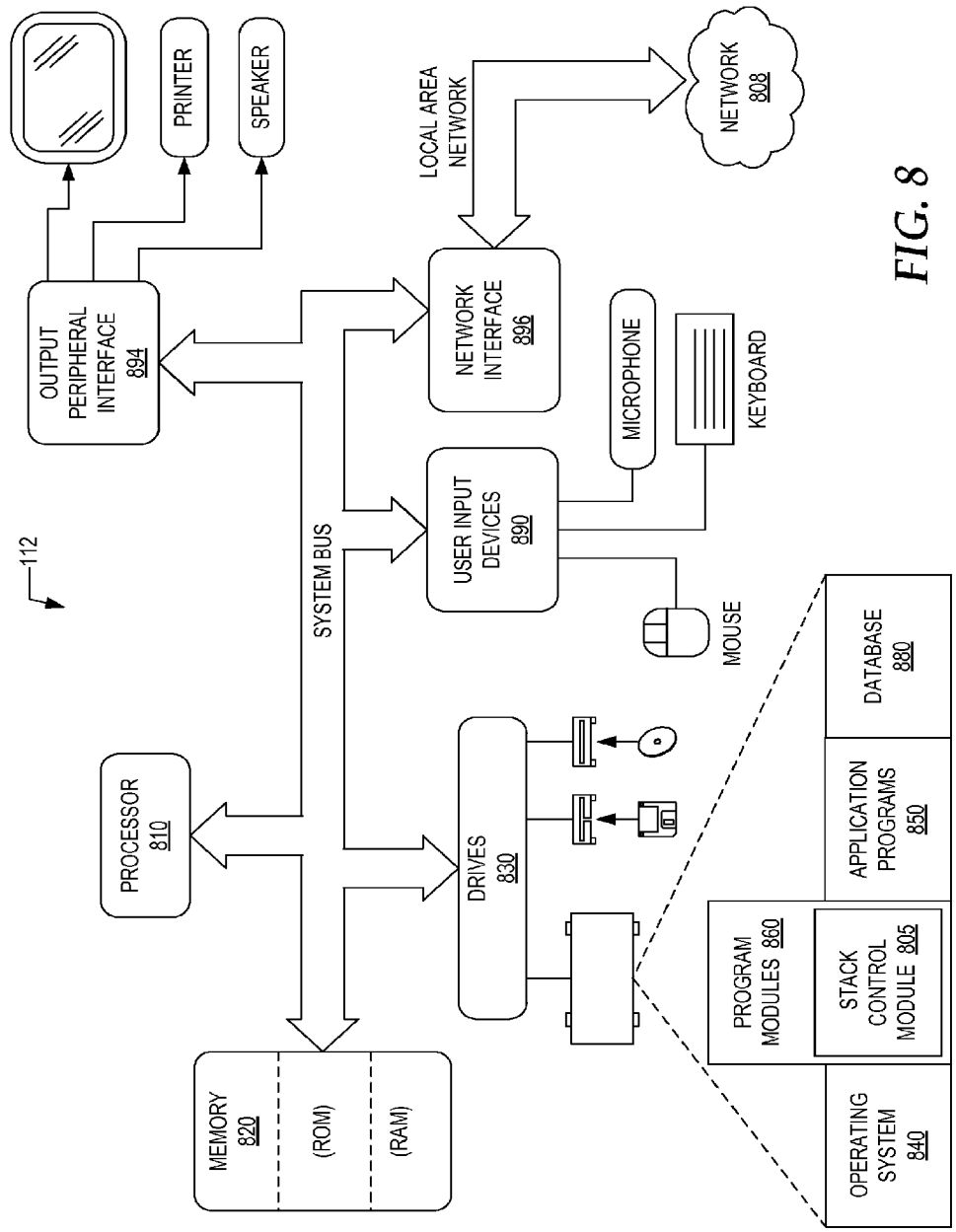
FIG. 8 is a block diagram illustrating a computer hardware architecture corresponding to an example controller, all arranged in accordance with at least some embodiments described herein.

FIG. 8 is a block diagram illustrating a computer hardware architecture corresponding to an example controller 112 configured in accordance with at least some embodiments presented herein. FIG. 8 includes a controller 112, including a processor 810, memory 820 and one or more drives 830. The controller 112 may be implemented as a conventional computer system, an embedded control computer, a laptop, or a server computer, a mobile device, a set-top box, a kiosk, a vehicular information system, a mobile telephone, a customized machine, or other hardware platform.

The drives 830 and their associated computer storage media, provide storage of computer readable instructions, data structures, program modules and other data for the controller 112. The drives 830 can include an operating system 840, application programs 850, program modules 860, and a database 880. The program modules 860 may include a heat transfer stack control module 805. The heat transfer stack control module 805 may be adapted to execute the process 700 for implementing an electrocaloric effect heat pump 102 over a wide operating temperature range 310 of a heat source 106 as described in greater detail above (e.g., see previous description with respect to one or more of FIGS. 1-7). In some embodiments, the heat transfer stack control module 805 may detect an operating temperature 402 of the heat source 106, and in response, control the application of the electrode control signal from the power source 110 to the electrodes 114 of the applicable heat transfer stacks. The controller 112 further includes user input devices 590 through which a user may enter commands and data. Input devices can include an electronic digitizer, a microphone, a keyboard and pointing device, commonly referred to as a mouse, trackball or touch pad. Other input devices may include a joystick, game pad, satellite dish, scanner, or the like.

These and other input devices can be coupled to the processor 810 through a user input interface that is coupled to a system bus, but may be coupled by other interface and bus structures, such as a parallel port, game port or a universal serial bus ("USB"). Computers such as the controller 112 may also include other peripheral output devices such as speakers, which may be coupled through an output peripheral interface 894 or the like.

The controller 112 may operate in a networked environment using logical connections to one or more computers, such as a remote computer coupled to a network interface 896. The remote computer may be a personal computer, a server, a router, a network PC, a peer device or other common network node, and can include many or all of the elements described above relative to the controller 112. Networking environments are commonplace in offices, enterprise-wide area networks ("WAN"), local area networks ("LAN"), intranets, and the Internet.

When used in a LAN or WLAN networking environment, the controller 112 may be coupled to the LAN through the network interface 896 or an adapter. When used in a WAN networking environment, the controller 112 typically includes a modem or other means for establishing communications over the WAN, such as the Internet or the network 808. The WAN may include the Internet, the illustrated network 808, various other networks, or any combination thereof. It will be appreciated that other mechanisms of establishing a communications link, ring, mesh, bus, cloud, or network between the computers may be used.

According to some embodiments, the controller 112 may be coupled to a networking environment. The controller 112 may include one or more instances of a physical computer-readable storage medium or media associated with the drives 830 or other storage devices. The system bus may enable the processor 810 to read code and/or data to/from the computer-readable storage media. The media may represent an apparatus in the form of storage elements that are implemented using any suitable technology, including but not limited to semiconductors, magnetic materials, optical media, electrical storage, electrochemical storage, or any other such storage technology. The media may represent components associated with memory 820, whether characterized as RAM, ROM, flash, or other types of volatile or nonvolatile memory technology. The media may also represent secondary storage, whether implemented as the storage drives 830 or otherwise.

Hard drive implementations may be characterized as solid state, or may include rotating media storing magnetically-encoded information.

The storage media may include one or more program modules 860. The program modules 860 may include software instructions that, when loaded into the processor 810 and executed, transform a general-purpose computing system into a special-purpose computing system. As detailed throughout this description, the program modules 860 may provide various tools or techniques by which the controller 112 may participate within the overall systems or operating environments using the components, logic flows, and/or data structures discussed herein.

The processor 810 may be constructed from any number of transistors or other circuit elements, which may individually or collectively assume any number of states. More specifically, the processor 810 may operate as a state machine or finite-state machine Such a machine may be transformed to a second machine, or specific machine by loading executable instructions contained within the program modules 860. These computer-executable instructions may transform the processor 810 by specifying how the processor 810 transitions between states, thereby transforming the transistors or other circuit elements constituting the processor 810 from a first machine to a second machine The states of either machine may also be transformed by receiving input from the one or more user input devices 890, the network interface 896, other peripherals, other interfaces, or one or more users or other actors. Either machine may also transform states, or various physical characteristics of various output devices such as printers, speakers, video displays, or otherwise.

Encoding the program modules 860 may also transform the physical structure of the storage media. The specific transformation of physical structure may depend on various factors, in different implementations of this description. Examples of such factors may include, but are not limited to: the technology used to implement the storage media, whether the storage media are characterized as primary or secondary storage, and the like. For example, if the storage media are implemented as semiconductor-based memory, the program modules 860 may transform the physical state of the semiconductor memory 820 when the software is encoded therein. For example, the software may transform the state of transistors, capacitors, or other discrete circuit elements constituting the semiconductor memory 820.

As another example, the storage media may be implemented using magnetic or optical technology such as drives 830. In such implementations, the program modules 860 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. It should be appreciated that various other transformations of physical media are possible without departing from the scope and spirit of the present description.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A heat transfer device comprising:
a first heat transfer stack, comprising:
alternating layers of a first electrocaloric effect material and a first thermal rectifier, wherein the first electrocaloric effect material is adapted to operate within a first effective temperature range, and in each layer of the alternating layers, the first thermal rectifier arranged in thermal contact with the first electrocaloric effect material; and
a second heat transfer stack positioned adjacent to the first heat transfer stack, comprising:
alternating layers of a second electrocaloric effect material and a second thermal rectifier adapted to operate within a second effective temperature range that is different than the first effective temperature range, and in each layer of the alternating layers, the second thermal rectifier arranged in thermal contact with the second electrocaloric effect material.

2. The heat transfer device of claim 1, wherein the first electrocaloric effect material is different from the second electrocaloric effect material.

3. The heat transfer device of claim 1, wherein each layer of electrocaloric effect material within the first heat transfer stack includes a same electrocaloric effect material, dimension and shape, and wherein each layer of thermal rectifier within the first heat transfer stack includes a same thermal rectifier material, dimension and shape.

4. The heat transfer device of claim 1, further comprising a plurality of first heat transfer stacks and a plurality of second heat transfer stacks arranged in an alternating pattern.

5. The heat transfer device of claim 4, wherein the alternating pattern comprises an array of alternating first heat transfer stacks and second heat transfer stacks.

6. The heat transfer device of claim 1, wherein the first effective temperature range and the second effective temperature range together comprise a combined effective temperature range that encompasses a heat source operating temperature range associated with a heat source.

7. The heat transfer device of claim 6, further comprising first electrodes positioned to apply an electric field across the first electrocaloric effect material, and second electrodes positioned to apply an electric field across the second electrocaloric effect material.

8. The heat transfer device of claim 7, further comprising a controller operative to selectively control the application of the electric field from a power source to one or more of the first electrodes and/or the second electrodes during operation of the heat source at any temperature within the heat source operating temperature range.

9. The heat transfer device of claim 7, further comprising a controller operative to selectively control the application of the electric field from a power source to the first electrodes during operation of the heat source at temperatures within the first effective temperature range and to selectively control the application of the electric field from the power source to the second electrodes during operation of the heat source at temperatures within the second effective temperature range.

10. The heat transfer device of claim 7, wherein the electric field comprises one of: an oscillating voltage, a pulsed signal, a pulsed direct current (DC) voltage, an alternating current (AC) voltage, a ramped signal, a sawtooth signal, or a triangular signal.

11. The heat transfer device of claim 7, wherein the first effective temperature range and the second effective temperature range overlap in an overlapping temperature range of the heat source operating temperature range.

12. The heat transfer device of claim 11, further comprising a controller operative to selectively control the application of the electric field from a power source to the first electrodes and to the second electrodes during operation of the heat source at any temperature within the overlapping temperature range.

13. The heat transfer device of claim 7, wherein the first heat transfer stack is configured with the first thermal rectifier disposed between the first electrocaloric effect material and the heat source, and wherein the second transfer stack is configured with the second thermal rectifier disposed between the second electrocaloric effect material and the heat source.

14. A method to transfer heat from a heat source at any temperature within an operating temperature range of the heat source, the method comprising:
at a first temperature of the operating temperature range of the heat source, applying a first electric field across a first electrocaloric effect material of a first heat transfer stack that is arranged in thermal contact with the heat source, wherein the first heat transfer stack is adapted to operate within a first effective temperature range;
during application of the first electric field, transferring heat through a first thermal rectifier of the first heat transfer stack that is arranged in thermal contact with the heat source and the first electrocaloric effect material to a heat dump;
at a second temperature of the operating temperature range of the heat source, applying a second electric field across a second electrocaloric effect material of a second heat transfer stack that is arranged in thermal contact with the heat source, wherein the second heat transfer stack is adapted to operate within a second effective temperature range; and
during application of the second electric field, transferring heat through a second thermal rectifier of the second heat transfer stack that is arranged in thermal contact with the heat source and the second electrocaloric effect material to the heat dump.

15. The method of claim 14, wherein the first temperature is within an effective temperature range of the first electrocaloric effect material and outside an effective temperature range of the second electrocaloric effect material, and wherein the second temperature is within the effective temperature range of the second electrocaloric effect material and is outside the effective temperature range of the first electrocaloric effect material.

16. The method of claim 14, wherein a first surface of the first thermal rectifier abuts a surface of the heat source and a second surface of the first thermal rectifier abuts a surface of the first electrocaloric effect material such that the first electrocaloric effect material is in indirect thermal contact with the heat source and such that the electrocaloric effect material is in direct thermal contact with the first thermal rectifier.

17. The method of claim 14, further comprising:
removing the first electric field prior to applying the second electric field; and
resisting heat transfer through the first thermal rectifier in a direction from the heat dump toward the heat source after removing the first electric field.

18. The method of claim 17, further comprising:
detecting a rise in operating temperature of the heat source from the first temperature to the second temperature; and
in response to detecting the rise in operating temperature, removing the first electric field and applying the second electric field.

19. The method of claim 14, wherein applying the first electric field comprises applying one of: a first oscillating voltage, a first pulsed signal, a first pulsed DC voltage, a first AC voltage, a first ramped signal, a first sawtooth signal, or a first triangular signal, and
wherein applying the second electric field comprises applying one of: a second oscillating voltage, a second pulsed signal, a second pulsed DC voltage, a second AC voltage, a second ramped signal, a second sawtooth signal, or a second triangular signal.

20. A heat transfer system, comprising:
a plurality of heat transfer stacks arranged in an array that includes at least two heat transfer stacks adapted to operate within different effective temperature ranges, each heat transfer stack comprising:
an electrocaloric effect material,
electrodes positioned effective to apply an electric field across the electrocaloric effect material, and
a thermal rectifier arranged in thermal contact with the electrocaloric effect material; and
a controller operative to selectively apply the electric field to any one or more of the plurality of heat transfer stacks in accordance with an operating temperature of a heat source that is arranged in thermal contact with the plurality of heat transfer stacks.

21. The heat transfer system of claim 20, wherein each of the plurality of heat transfer stacks comprise a plurality of layers of alternating electrocaloric effect material and thermal rectifier, and wherein the plurality of heat transfer stacks are arranged in an alternating pattern within the array in accordance with effective temperature ranges.

22. The heat transfer system of claim 21, wherein each layer of electrocaloric effect material within a heat transfer stack includes a same electrocaloric effect material, dimension and shape, and wherein each layer of thermal rectifier within the heat transfer stack includes a same thermal rectifier material, dimension and shape.

23. The heat transfer system of claim 20, wherein the controller being operative to selectively apply the electric field to the subset of the plurality of heat transfer stacks in accordance with the operating temperature of the heat source comprises the controller being operative to detect a change in the operating temperature of the heat source from a first operating temperature that corresponds to a first subset of the plurality of heat transfer stacks to a second operating temperature that corresponds to a second subset of the plurality of heat transfer stacks, and in response, to remove the electric field from the first subset and to apply the electric field to the second subset.

24. The heat transfer system of claim 20, wherein the electric field comprises one of: an oscillating voltage, a pulsed signal, a pulsed direct current voltage, an alternating current voltage, a ramped signal, a sawtooth signal, or a triangular signal.

* * * * *

UNITED STATES PATENT AND TRADEMARK OFFICE
CERTIFICATE OF CORRECTION

| | |
|---|---|
| PATENT NO. | : 9,157,669 B2 |
| APPLICATION NO. | : 13/145948 |
| DATED | : October 13, 2015 |
| INVENTOR(S) | : Kruglick |

It is certified that error appears in the above-identified patent and that said Letters Patent is hereby corrected as shown below:

Specification

In Column 1, Line 8, delete "§371" and insert -- § 371 --, therefor.

In Column 5, Line 8, delete "cilia," and insert -- alia, --, therefor.

In Column 13, Line 18, delete "machine Such" and insert -- machine. Such --, therefor.

In Column 13, Line 25, delete "machine The" and insert -- machine. The --, therefor.

In Column 15, Line 9, delete "thereof" and insert -- thereof. --, therefor.

Signed and Sealed this
Fifteenth Day of March, 2016

Michelle K. Lee
*Director of the United States Patent and Trademark Office*